US012777612B2

(12) United States Patent
Chaperon et al.

(10) Patent No.: US 12,777,612 B2
(45) Date of Patent: Oct. 27, 2026

(54) ELECTRICAL CONVERTER CONFIGURED TO SUPPLY AN ELECTRIC MACHINE WITH POWER, ELECTRICAL MODULE COMPRISING SUCH A CONVERTER, AND METHOD FOR USING SUCH AN ELECTRICAL MODULE

(71) Applicant: SAFRAN ELECTRICAL & POWER, Blagnac (FR)

(72) Inventors: Vincent Chaperon, Moissy-Cramayel (FR); Samir Nehme, Moissy-Cramayel (FR); Rémi Goncalves, Moissy-Cramayel (FR); Räis M'Fumu Ambil, Moissy-Cramayel (FR); Abdoulahad Thiam, Moissy-Cramayel (FR)

(73) Assignee: SAFRAN ELECTRICAL & POWER, Blagnac (FR)

( * ) Notice: Subject to any disclaimer, the term of this patent is extended or adjusted under 35 U.S.C. 154(b) by 260 days.

(21) Appl. No.: 18/698,075

(22) PCT Filed: Sep. 28, 2022

(86) PCT No.: PCT/EP2022/076915
§ 371 (c)(1),
(2) Date: Sep. 26, 2024

(87) PCT Pub. No.: WO2023/057269
PCT Pub. Date: Apr. 13, 2023

(65) Prior Publication Data

US 2025/0016952 A1 Jan. 9, 2025

(30) Foreign Application Priority Data

Oct. 6, 2021 (FR) ...................................... 2110609

(51) Int. Cl.
*H05K 7/20* (2006.01)
*H02M 1/32* (2007.01)
*H02M 7/00* (2006.01)

(52) U.S. Cl.
CPC ........ *H05K 7/20236* (2013.01); *H02M 1/327* (2021.05); *H02M 7/003* (2013.01); *H05K 7/20927* (2013.01)

(58) Field of Classification Search
CPC ...... H02K 11/33; H02K 2213/06; H02K 9/19; H02M 1/327; H02M 7/003; H05K 7/20236; H05K 7/20927; H10W 40/47
See application file for complete search history.

(56) References Cited

U.S. PATENT DOCUMENTS

2005/0180104 A1 8/2005 Olesen
2013/0301220 A1* 11/2013 Hotta ..................... H02K 11/33 361/699

(Continued)

FOREIGN PATENT DOCUMENTS

FR 2895845 7/2007

OTHER PUBLICATIONS

International Search Report filed in PCT/EP2022/076915 mailed Jan. 31, 2023.
French Search Report filed in FR 2110609 dated Jun. 17, 2022.

*Primary Examiner* — Naishadh N Desai
(74) *Attorney, Agent, or Firm* — RANKIN, HILL & CLARK LLP

(57) ABSTRACT

An electrical converter configured to supply an electric machine, in particular for an aircraft, with power, comprising an annular stator and a rotor. The electrical converter comprising a plurality of power inverters, each comprising a plurality of power devices that are configured to be connected to the annular stator so as to supply the electric machine with power, a casing comprising a plurality of inner (Continued)

baths and outer baths, a coolant circuit configured to supply each inner bath and each outer bath with coolant. The power devices being mounted in the inner baths and the outer baths so as to allow all of the power devices to be cooled.

19 Claims, 5 Drawing Sheets

(56) References Cited

U.S. PATENT DOCUMENTS

2019/0181717 A1* 6/2019 Zhou ........................ H02K 5/20
2019/0291570 A1* 9/2019 Tang ...................... B60K 11/04

* cited by examiner

ELECTRICAL CONVERTER CONFIGURED TO SUPPLY AN ELECTRIC MACHINE WITH POWER, ELECTRICAL MODULE COMPRISING SUCH A CONVERTER, AND METHOD FOR USING SUCH AN ELECTRICAL MODULE

TECHNICAL FIELD

The present invention relates to the field of cooling an electrical converter supplying an electric machine with power, in particular an electric motor of an aircraft participating in the propulsion of said aircraft.

In a known manner, an electric motor may be combined with an electrical converter in such a way as to provide mechanical energy from a DC voltage source, for example, an electric battery. In practice, the electrical converter makes it possible to convert the DC voltage into AC voltage, in particular three-phase. To enable electrical conversion, the electrical converter comprises several power inverters each with three power modules, i.e. one per inverter branch for a three-phase inverter.

In order to limit the size and reduce the length of wiring, it has been proposed to combine the electric motor and its converter in the same electrical module, i.e., in a same assembly. In practice, the electrical module is installed in thermal and vibration environments that are severe and which increase the risk of breakdowns. To limit this risk, it is known to provide redundancies in order to ensure continuity of service. An immediate redundancy solution would be to provide two separate electrical modules, but this excessively penalizes the size and mass. Therefore, it was proposed to provide an electrical converter comprising two independent functional channels. In other words, the electrical converter is shared between two functional channels that may operate individually or collectively. For this purpose, a converter may comprise a large number of power modules according to the desired power.

In order to form a compact electrical module, an annular-shaped converter has been proposed in order to define an internal longitudinal passage wherein a shaft of the electric motor may be mounted. For this purpose, the electric motor extends longitudinally and comprises an annular stator inside of which a rotor connected to the motor shaft is mounted. The power modules are organized in an annular manner in the converter to be connected directly to the annular stator of the electric motor to reduce the length of the electrical connections, and consequently the risk of malfunction.

For optimum cooling, the power modules are positioned on the outer periphery of the electrical converter to maximize heat exchanges with the outside of the electrical module. However, due to redundancy constraints, the number of power modules is substantial and the cooling requirements are very high.

To house many power modules, an immediate solution would be to increase the outer surface area by increasing the diameter or length of the electrical converter, but this goes against the objectives of reducing the size and mass.

The invention thus aims to eliminate at least some of these disadvantages by proposing an electrical converter with improved cooling that allows high redundancy and limits the length of the connections.

Cooling systems according to the prior art are known by the patent applications US201901817171A1, US20050180104A1 and FR2895845A.

SUMMARY

The invention relates to an electrical converter configured to supply an electric machine with power, in particular for aircraft, comprising an annular stator and a rotor, the electrical converter comprising:

- a plurality of power inverters each comprising a plurality of power devices configured to be connected to the annular stator so as to supply the electric machine with power,
- a casing, annular in shape, extending longitudinally along an axis X and defining a radially inner surface and a radially outer surface, the casing comprising a plurality of cooling baths formed in the radially inner surface, called inner baths, and in the radially outer surface, called outer baths,
- a cooling circuit configured to supply each inner bath and each outer bath with coolant, and
- the power devices being mounted in the inner baths and the outer baths in such a way as to allow cooling of all the power devices.

Thanks to the invention, the devices are spaced apart from each other and arranged according to an inner ring and an outer ring, which limits the formation of hot zones. The presence of inner baths and outer baths allows each bath to be cooled individually and homogeneously with coolant. Thus, an electrical converter with a large number of power devices may be optimally cooled while maintaining a small size.

Preferably, the inner baths and/or the outer baths have the same longitudinal position. Thus, the power devices may be connected to the annular stator by short cables of the same length, which limits the risk of electrical faults.

According to one aspect, the electrical converter comprises as many inner baths as there are outer baths. Preferably, the inner baths and the outer baths are alternated at the periphery of the casing. Preferably, the inner baths and the outer baths are angularly distributed at the periphery of the casing. This allows the power devices to be optimally distributed to avoid local heating.

According to one aspect of the invention, the cooling circuit comprises an inlet and an outlet that are diametrically opposite and connected by at least two independent, preferably diametrically opposite, cooling branches. This makes it possible to reduce the flow rate as well as the pressure losses.

Preferably, the cooling circuit comprises channels extending through the thickness of the casing and connecting the inner baths and the outer baths. Thus, the cooling circuit is integrated into the casing, which limits the size of the casing and allows the body of the casing to be used to dissipate the heat from the power devices.

Preferably, two adjacent baths are connected by a plurality of independent channels, preferably, more than 10. This makes it possible to substantially reduce the pressure losses.

Preferably, at least one power device comprises a power module associated with a heat sink, the heat sink being mounted in an inner bath or an outer bath. Using a heat sink makes it possible to capture the calories of the power module so that they are optimally discharged with the coolant from the baths.

Preferably, the heat sink comprises fins positioned in the inner bath or in the outer bath so as to increase the exchange surface and optimize the transfer of calories.

Preferably, the power device comprises locking members configured to cooperate with receiving members formed in the casing so as to maintain the heat sink in the inner bath or the outer bath. Preferably, the locking members allow removable mounting.

The invention also relates to an electrical module comprising an electric machine, in particular for aircraft, comprising an annular stator and a rotor, and an electrical converter, such as presented previously, the power devices of which are connected to the annular stator in order to supply the electric machine with power. Preferably, the annular stator has substantially the same diameter as the casing of the electrical converter in order to make short electrical connections.

Preferably, the electrical converter is supplied with power by a DC voltage source.

According to a first aspect, the electrical converter comprising a cooling circuit, hereinafter referred to as the first cooling circuit, the electric machine comprising a cooling circuit, hereinafter referred to as the second cooling circuit, the first cooling circuit and the second cooling circuit are supplied in series with coolant. The low pressure losses are advantageously used to combine the two cooling circuits and as such gain in compactness.

According to a second aspect, the electrical converter comprising a cooling circuit, hereinafter referred to as the first cooling circuit, the electric machine comprising a cooling circuit, hereinafter referred to as the second cooling circuit, the first cooling circuit and the second cooling circuit are supplied in parallel with coolant.

The invention further relates to a method for using an electrical module, such as presented previously, comprising steps consisting of:

Supplying the electric machine via the power devices of the electrical converter, Circulating a coolant in the cooling circuit of the electrical converter in order to cool said power devices.

DESCRIPTION OF THE DRAWINGS

The invention will be better understood upon reading the following description, given as an example, and referring to the following figures, given as non-limiting examples, wherein identical references are given to similar objects.

FIG. 2 is a schematic perspective representation of an electrical converter according to an embodiment according to the invention.

It should be noted that the figures set out the invention in detail in order to implement the invention, said figures may of course be used to better define the invention where applicable.

DETAILED DESCRIPTION

Figure 1:
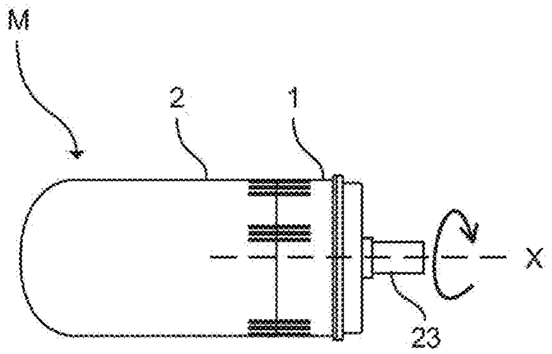
FIG. 1 is a schematic representation of an electrical module according to one embodiment of the invention.

In reference to [FIG. 1], the invention relates to an electrical module M, in particular for aircraft, comprising an electric machine 2 and an electrical converter 1 to supply the electric machine 2.

Figure 2:
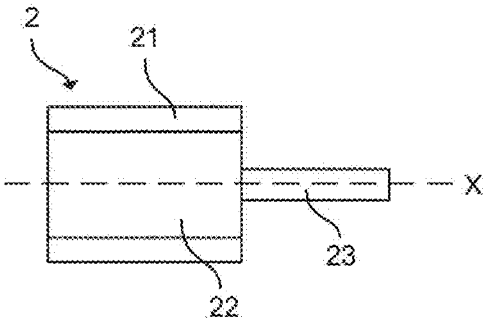
FIG. 2 is a schematic cross-sectional representation of an electric machine of the electrical module of FIG. 1.

As shown in [FIG. 2], the electric machine 2 comprises an annular stator 21 within which is mounted a rotor 22 extending along a longitudinal axis X. In this example, the annular stator 21 defines a plurality of electrical Y-connectors, with three branches, which are supplied by the electrical converter 1 with power so as to be able to drive the rotor 22. Subsequently, an electric machine 2 will be presented that operates as a motor, but it goes without saying that it could also operate as a generator. In this example, as shown in FIGS. 1 and 2, the rotor 22 comprises a rotor shaft 23 that protrudes longitudinally along the axis X. The electric machine 2 preferably comprises a cooling circuit. The general structure of such an electric machine 2 is known and will not be presented in more detail.

Figure 5:
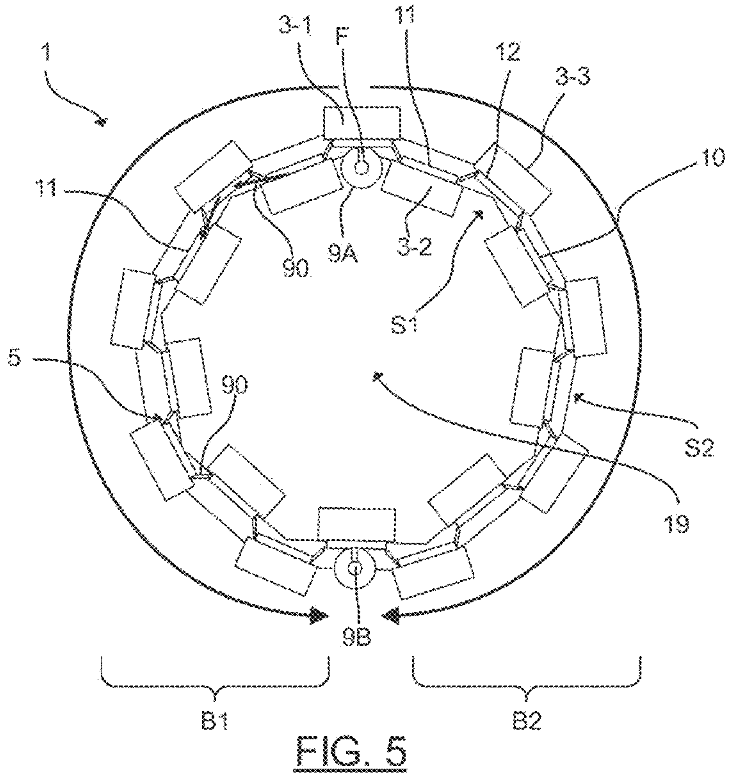
FIG. 5 is a schematic cross-sectional representation of an electrical converter with a two-branch cooling circuit.

In reference to [FIG. 5], the electrical converter 1 comprises a casing 10, annular in shape, extending longitudinally along the axis X and defining a radially inner surface S1 and a radially outer surface S2. Preferably, the casing 10 has a diameter substantially equal to the diameter of the annular stator 21 of the electric machine 2 so as to allow a direct electrical connection with the annular stator 21 as will be presented below. The casing 10 defines a central opening 19 wherein the rotor shaft 23 may be inserted. Preferably, the rotor shaft 23 may be associated, for example, with a propeller pitch actuator of an aircraft of the VTOL or STOL type.

Figure 3:
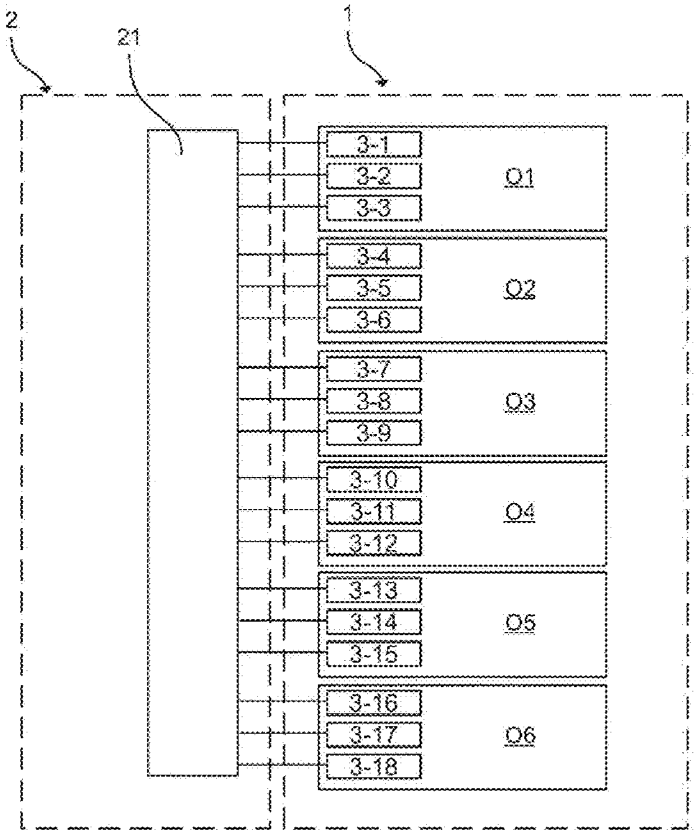
FIG. 3 is a schematic representation of an electrical converter connected to a stator of the electric machine.
Figure 4:
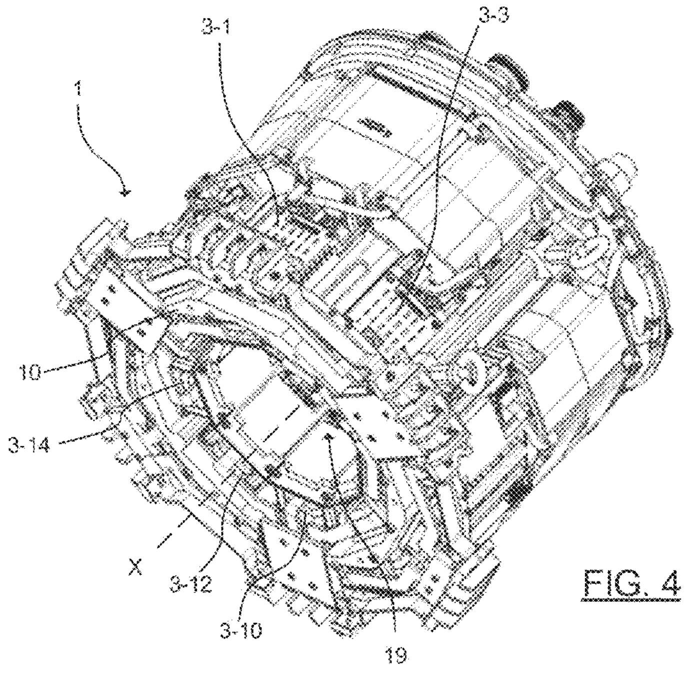

As schematically shown in [FIG. 3], the electrical converter 1 further comprises a plurality of power inverters O1-O6 each comprising a plurality of power devices 3-1; 3-18 configured to be connected to the annular stator 21 of the electric machine 2 in order to ensure redundancy. Each inverter O1-O6 is three-phase and is associated with three power devices 3-1; 3-18. Also, as shown in [FIG. 3], the electrical converter 1 comprises 18 power devices 3-1; 3-18 which are supplied by one or more voltage sources (not shown) in order to be able to supply the annular stator 21 with power and drive the rotor 22 in rotation.

Figure 6:
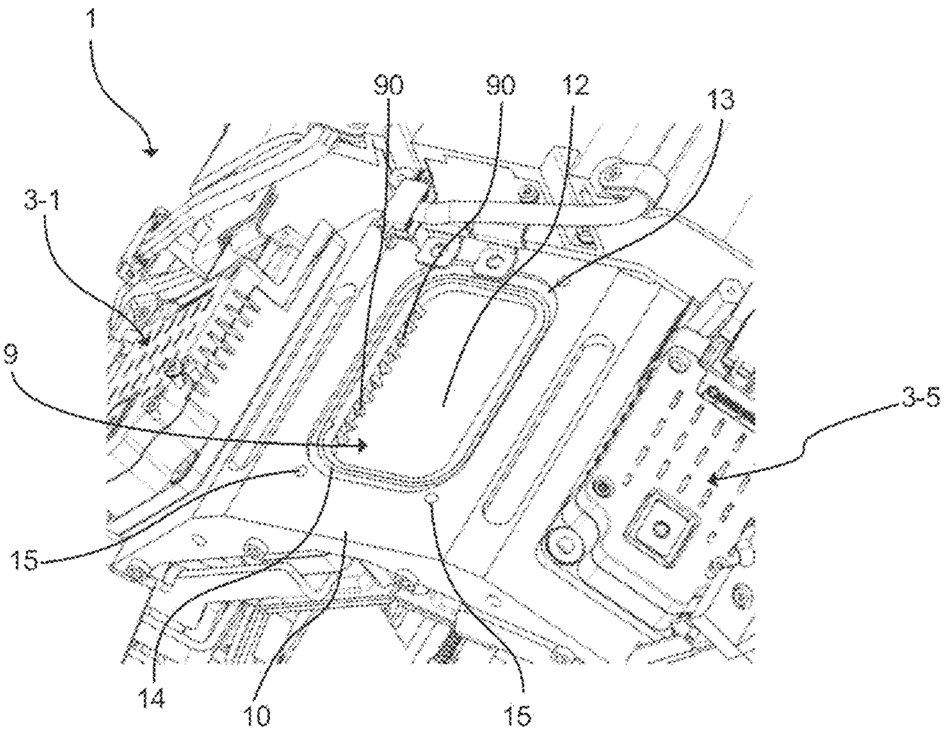
FIG. 6 is a schematic representation of an outer bath of the converter of FIG. 4 without a power device.

According to the invention, in reference to FIGS. 5 and 6, the casing 10 comprises a plurality of cooling baths formed in the radially inner surface S1, called inner baths 11, and in the radially outer surface S2, called outer baths 12. The electrical converter 1 further comprises a cooling circuit 9 configured to supply each inner bath 11 and each outer bath 12 with coolant F, in particular, with oil or the like. The power devices 3-1; 3-18 are mounted in the inner baths 11 and in the outer baths 12 so as to allow cooling of all the power devices 3-1; 3-18.

Thanks to the invention, the electrical converter 1 may be conveniently connected to the electric machine 2 with short connections while allowing optimal cooling of the power devices 3-1; 3-18 which are advantageously distributed over the inner surface S1 and the outer surface S2 of the casing 10. Thus, the annular shape of the electrical converter 1 is used to make optimum use of the available surface area. The different elements of the electrical module 1 will now be presented in detail.

In this example, the casing 10 comprises inner baths 11 and outer baths 12 that are formed in the thickness of the casing 10. In other words, the baths 11, 12 are cavities directly formed in the casing 10 of the electrical converter 1 in order to limit the size and improve cooling. Preferably, the casing 10 is made of a metal material.

As shown in [FIG. 6], each inner bath 11 or outer bath 12 has a substantially rectangular shape in order to correspond to that of a power device 3-1; 3-18, but it goes without saying that it could be of a different shape. The depth of a bath 11, 12, defined according to the radial direction with respect to the longitudinal axis X, is a function of the power device 3-1; 3-18.

The inner baths 11 and the outer baths 12 are preferably formed at a longitudinal end of the casing 10 of the electrical converter 1, the end intended to be connected to the electric machine 2. Preferably, the inner baths 11 and the outer baths 12 are in the same longitudinal position, defined along the axis X. Thus, the power devices 3-1; 3-18 may be connected by connections of the same length to the annular stator 21, which limits the risk of failure.

The number of inner baths 11 and outer baths 12 depends on the number of power devices 31; 3-18 to be cooled. In this example, in reference to [FIG. 5], the electrical converter 10 comprises as many inner baths 11 as outer baths 12. Preferably, the inner baths 11 and the outer baths 12 are alternated at the periphery of the casing 10, in particular, the inner baths 11 and the outer baths 12 are angularly distributed at the periphery of the casing 10, which makes it possible to benefit from optimal heat distribution as shown in [FIG. 5].

In this example, the power devices 3-1; 3-18 have the same longitudinal position but are separated into two groups having two different radial positions (inner ring and outer ring). It goes without saying that the longitudinal positions may be different.

As indicated previously, in reference to [FIG. 5], the electrical converter 1 comprises a cooling circuit 9 configured to supply each inner bath 11 and each outer bath 12 with coolant F, in particular, oil.

In this example, still in reference to [FIG. 5], the cooling circuit 9 comprises an inlet 9A configured to supply the cooling circuit 9 with coolant F and an outlet 9B to discharge the coolant F. Preferably, the cooling circuit 9 comprises a single inlet 9A and a single outlet 9B, but it goes without saying that they could be more numerous.

In this example, the inlet 9A and the outlet 9B are diametrically opposite and connected by two independent cooling branches B1, B2, preferably diametrically opposite. The branches B1, B2 are symmetrical in order to cool all the power devices 3-1; 3-18 in a similar way. Using two branches B1, B2 makes it possible to reduce the flow rate and therefore the pressure losses compared to a single branch. It goes without saying that a single branch could however be suitable.

The cooling circuit 9 comprises channels 90 extending in the thickness of the casing 10 to connect the inner baths 11 and the outer baths 12. Preferably, two adjacent baths, in particular an inner bath 11 and an outer bath 12, are connected by a plurality of independent channels 90, preferably parallel. The cross-section of the independent channels 90 is determined to optimize the pressure losses and reduce the flow rate. In this example, 12 independent channels are provided between each bath 11, 12. Preferably, the independent channels 90 lead into a side wall of an inner bath 11 or an outer bath 12 as shown in [FIG. 6] and in [FIG. 8]. Preferably, each independent channel 90 extends in a plane transverse to the axis X so as to allow angular circulation.

In this example, in reference to FIGS. 6 to 9, the power devices 3-1; 3-18 are identical and only the power device 3-3 mounted in an outer bath 12 will be presented in detail. It goes without saying that the description applies analogously to the mounting of a dissipation device in an inner bath 11.

Figure 7:
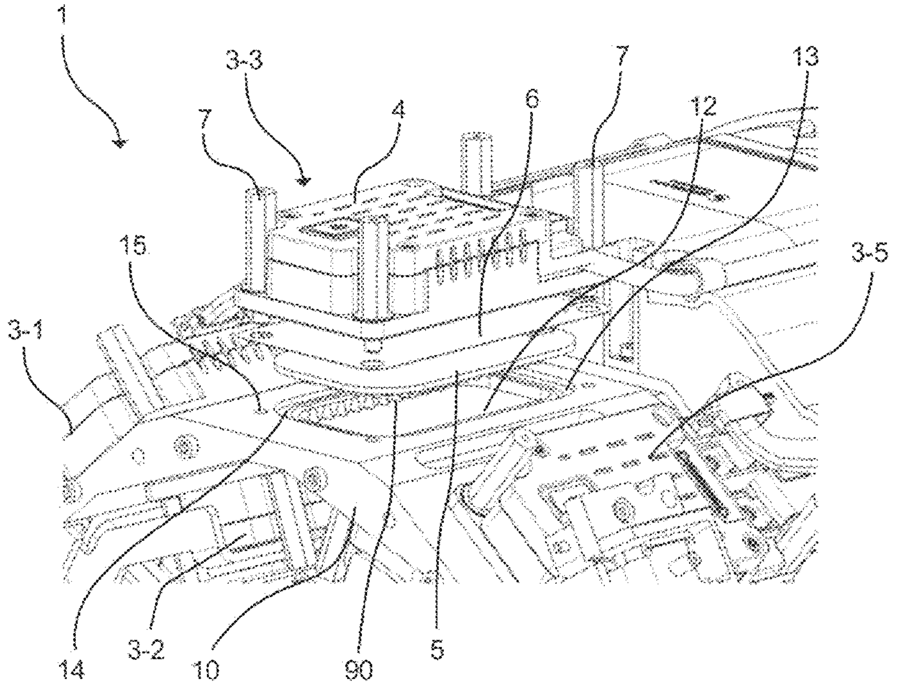
FIG. 7 is a schematic representation of a step of mounting a power device in the outer bath of FIG. 6.
Figure 8:
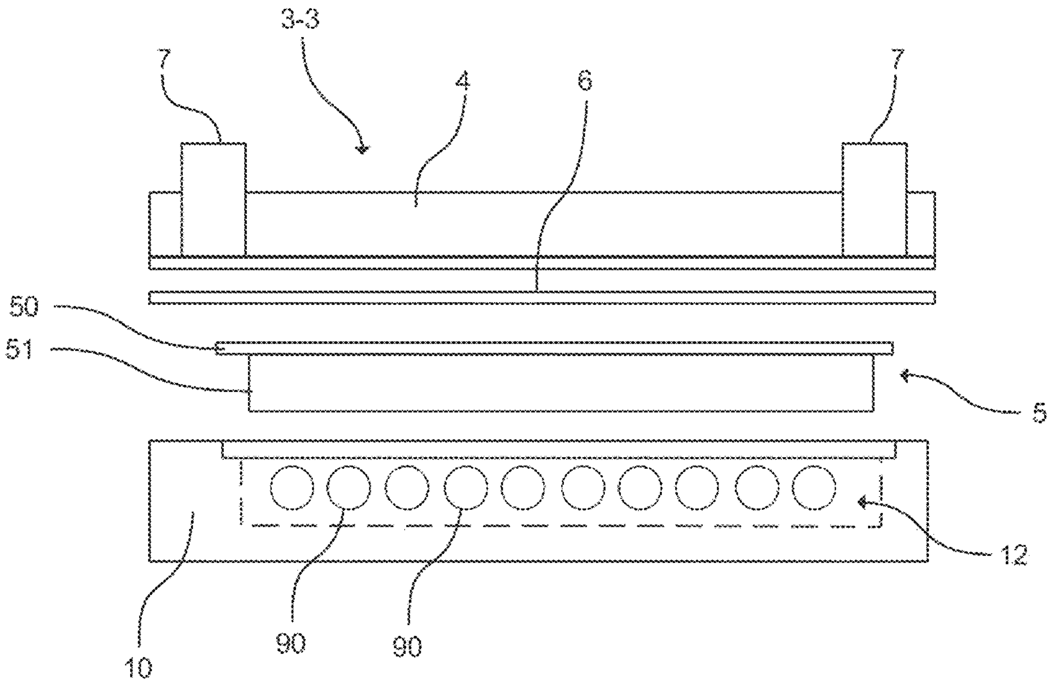
FIG. 8 is a schematic side representation of a power device and an outer bath.
Figure 9:
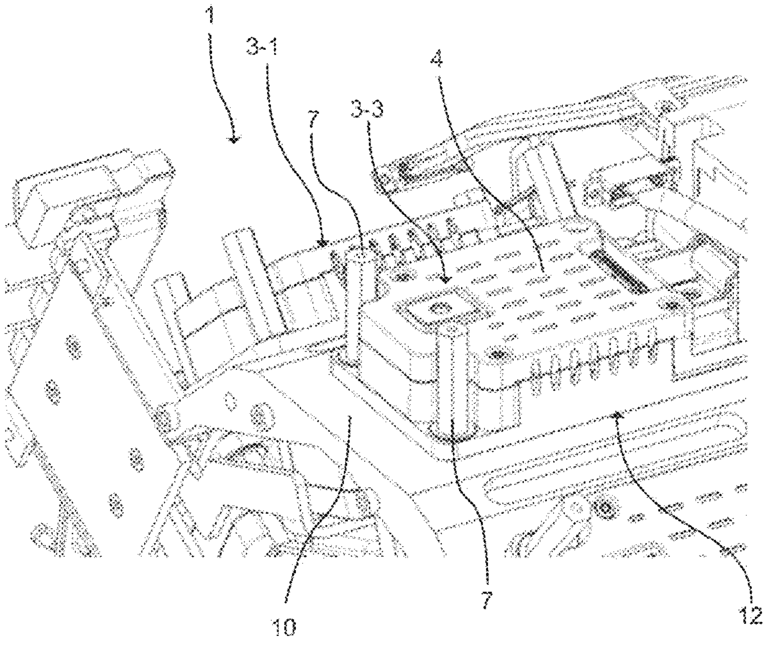
FIG. 9 is a schematic representation of a power device mounted in an outer bath of FIG. 6.

In reference to FIGS. 7 and 8, the power device 3-3 comprises a power module 4, comprising electronic components, which forms the main functional element. The power module 4 comprises electrical connectors and a heat-conducting enclosure. The power device 3-3 comprises a heat sink 5 that is configured to conduct and dissipate the heat generated by the power module 4, in particular, by conduction.

The heat sink 5 is positioned against a lower face of the power module 4. In this example, the power device 3-3 comprises a conduction plate 6 mounted at the interface between the power module 4 and the heat sink 5 to facilitate heat dissipation. Such a conduction plate 6 is optional.

The heat sink 5 comprises a main plate 50 from which several protruding fins 51 extend configured to increase the exchange surface and dissipate the calories received by the main plate 50 in contact with the conduction plate 6. Preferably, in the mounted position, the fins 51 extend into the outer bath 12 such that the coolant F takes the calories from the surface of the fins 51. Preferably, each fin 51 extends orthogonally to the main plate 50 and has a square-shaped section, also called a "diamond". The size and shape of the fins 51 are determined so as to optimize the cooling and the pressure loss of the coolant F circulating in each bath 11, 12. Thus, each heat sink 5 is mounted in an inner bath 11 or an outer bath 12 in order to bathe its fins 51.

In reference to [FIG. 7], in order to ensure optimum sealing, the outer bath 12 comprises a recess 13 of a shape complementary to that of the main plate 50 of the heat sink 5 so as to achieve a nesting by form-fitting. The recess 13 further comprises a seal 14, preferably peripheral, configured to be compressed by the main plate 50 of the heat sink 5 in the mounted position.

Preferably, in reference to [FIG. 7], the power device 3-3 further comprises locking members 7 configured to cooperate with receiving members 15 formed in the casing 10 so as to mount the power device 3-3 in an outer bath 12, in particular, its heat exchanger 5. In this example, the power device 3-3 comprises four locking members 7, in particular screws, which are positioned at each corner of the pad of which the power device 3-3 has the shape. Four receiving members 15, for example tapped holes, are formed in the casing 10, externally to the outer bath 12. In the known mounted position shown in FIG. 9, when the locking members 7 cooperate with the receiving members 15, they ensure, on the one hand, a mechanical hold to the casing 10 and, on the other hand, a compression of the seal 14. The fins 51 are bathed in the outer bath 12 which is sealed tightly. Such a power device 3-3 may thus be mounted removably, which facilitates maintenance. It goes without saying that the heat sink 5 could be welded directly to the casing 10.

To assemble the electrical module M, the power devices 3-1; 3-18 of the electrical converter 1 are mounted to the casing 10 then electrically connected to the electrical Y-connections of the annular stator 21 of the electric machine 2 by short and direct connections, which limits the risk of malfunction. During the supply of the electric machine 2 with power by the electric converter 1, coolant F is introduced through the inlet 9A in order to supply the cooling circuit 9 to collect the calories from the fins 51 before being discharged at the outlet 9B as shown in [FIG. 5]. The coolant F successively circulates between an alternation of inner baths 11 and outer baths 12 connected by independent channels 90 in order to cool each of the power devices 3-1; 3-18.

In reference to FIGS. 10 to 12, the electrical converter 1 comprises a cooling circuit 9, hereinafter referred to as the first cooling circuit 9, while the electric machine 2 comprises a cooling circuit, hereinafter referred to as the second cooling circuit 9', for cooling in particular the annular stator 21 (see [FIG. 2]).

Figure 10:
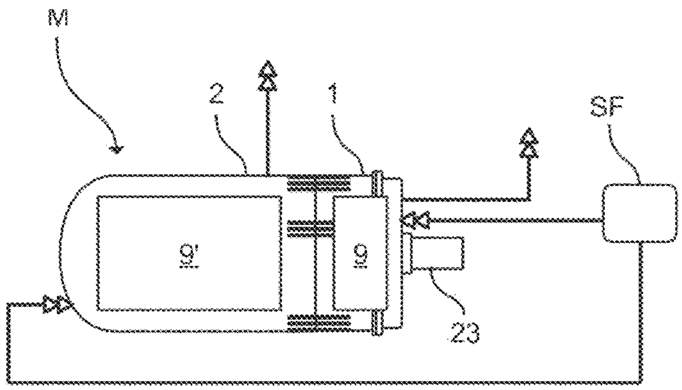
FIG. 10 is a schematic representation of a first embodiment of a cooling circuit in the electrical module.

In order to optimize the cooling of the electrical module M, the first cooling circuit 9 and the second cooling circuit 9' may be supplied in parallel with coolant F from a fluid source SF as shown in [FIG. 10].

Figure 11:
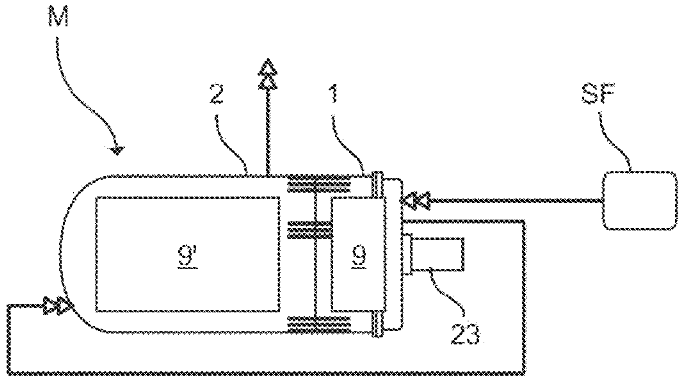
FIG. 11 is a schematic representation of a second embodiment of a cooling circuit in the electrical module.
Figure 12:
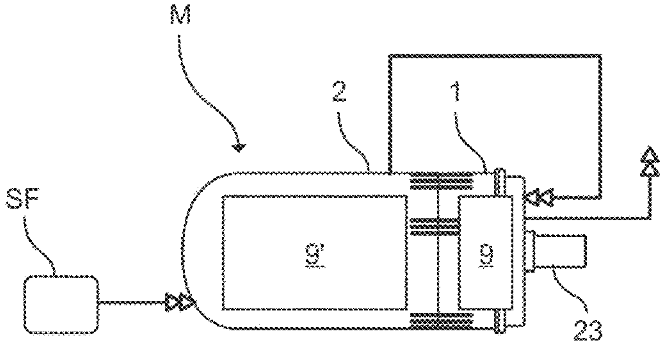
FIG. 12 is a schematic representation of a third embodiment of a cooling circuit in the electrical module.

Alternatively, in reference to FIGS. 11 and 12, the first cooling circuit 9 and the second cooling circuit 9' are supplied in series with coolant F from a fluid source SF. Such a solution may advantageously be considered given that the pressure losses are low in the first cooling circuit 9. The first cooling circuit 9 may be supplied before the second cooling circuit 9' as shown in [FIG. 11] or after as shown in [FIG. 12]. The configuration of [FIG. 11] is advantageous since it allows the electrical converter 1, which has higher cooling requirements, to be cooled first. Thus, the first cooling circuit 9 and the second cooling circuit 9' together form a global cooling circuit for the electrical module M.

The invention claimed is:

1. An electrical converter configured to supply an electric machine, comprising an annular stator and a rotor, the electrical converter comprising:
- a plurality of power inverters, each of the of power inverters comprising a plurality of power devices configured to be connected to the annular stator so as to supply the electric machine with power,
- a casing, having an annular shape, extending longitudinally along an axis and including a radially inner surface and a radially outer surface, the radially inner surface defining a plurality of inner baths and the radially outer surface defining a plurality of outer baths, and
- a cooling circuit configured to supply each of the inner baths and each of the outer baths with coolant, wherein the power devices are mounted in the inner baths and in the outer baths so as to allow cooling of all of the power devices.

2. The electrical converter according to claim 1, wherein the inner baths and the outer baths have a same longitudinal position.

3. The electrical converter according to claim 1, wherein the electrical converter comprises an equal number of the inner baths and the outer baths.

4. The electrical converter according to claim 1, wherein the inner baths and the outer baths are alternated at a periphery of the casing.

5. The electrical converter according to claim 1, wherein the inner baths and the outer baths are angularly distributed at a periphery of the casing.

6. The electrical converter according to claim 1, wherein the cooling circuit comprises an inlet and an outlet that are diametrically opposite one another and connected by at least two independent cooling branches.

7. The electrical converter according to claim 1, wherein the cooling circuit comprises channels extending in a thickness of a housing and connecting the inner baths and the outer baths.

8. The electrical converter according to claim 7, wherein two adjacent baths are connected by a plurality of the channels that are independent from one another.

9. The electrical converter according to claim 1, wherein at least one power device of the plurality of power devices comprises a power module associated with a heat sink, the heat sink being mounted in at least one of the inner bath and the outer bath.

10. The electrical converter according to claim 9, wherein the heat sink comprises fins positioned in at least one of the inner bath and the outer bath.

11. The electrical converter according claim 9, wherein the at least one power device of the plurality of power devices comprises locking members configured to cooperate with receiving members formed in the casing so as to maintain the heat sink in at least one of the inner bath and the outer bath.

12. An electrical module, comprising:
- an electric machine, comprising an annular stator and a rotor,
- a plurality of power inverters, each of the of power inverters comprising a plurality of power devices configured to be connected to the annular stator so as to supply the electric machine with power,
- a casing, having an annular shape, extending longitudinally along an axis and including a radially inner surface and a radially outer surface, the radially inner surface defining a plurality of inner baths and the radially outer surface defining a plurality of outer baths, and
- a cooling circuit configured to supply each of the inner baths and each of the outer baths with coolant, wherein the power devices are mounted in the inner baths and in the outer baths so as to allow cooling of all of the power devices, wherein the power devices are connected to the annular stator so as to supply the electric machine with power.

13. The electrical module according to claim 12, the electrical converter comprising a first cooling circuit and the electric machine comprising a second cooling circuit, wherein the first cooling circuit and the second cooling circuit are supplied in series with the coolant.

14. The electrical module according to claim 12, the electrical converter comprising a first cooling circuit and the electric machine comprising a second cooling circuit, wherein the first cooling circuit and the second cooling circuit are supplied in parallel with the coolant.

15. A method for using the electrical module according to claim 12, comprising:
- supplying the electric machine via the power devices of the electrical converter, and
- circulating the coolant in the cooling circuit of the electrical converter so as to cool said power devices.

16. The electrical converter according to claim 1, wherein the cooling circuit comprises an inlet and an outlet that are diametrically opposite one another and connected by at least two independent cooling branches that are diametrically opposite one another.

17. The electrical converter according to claim 7, wherein two adjacent baths are connected by more than 10 of the channels that are independent from one another.

18. The electrical converter according to claim 1, wherein the inner baths have a same longitudinal position.

19. The electrical converter according to claim 1, wherein the outer baths have a same longitudinal position.

* * * * *